United States Patent
Karasawa et al.

(10) Patent No.: US 7,535,720 B2
(45) Date of Patent: May 19, 2009

(54) ELECTRONIC APPARATUS

(75) Inventors: Takashi Karasawa, Nagano (JP); Satoshi Iwaya, Nagano (JP); Shinsuke Kogi, Nagano (JP)

(73) Assignee: Seiko Epson Corporation, Tokyo (JP)

( * ) Notice: Subject to any disclaimer, the term of this patent is extended or adjusted under 35 U.S.C. 154(b) by 701 days.

(21) Appl. No.: 10/966,772

(22) Filed: Oct. 14, 2004

(65) Prior Publication Data
US 2005/0168955 A1 Aug. 4, 2005

(30) Foreign Application Priority Data
Oct. 14, 2003 (JP) .......................... P2003-353938

(51) Int. Cl.
*H05K 5/00* (2006.01)

(52) U.S. Cl. .................. 361/752; 361/730; 361/785
(58) Field of Classification Search ............. 439/501; 347/7; 361/730, 752, 785
See application file for complete search history.

(56) References Cited

U.S. PATENT DOCUMENTS

| | | | |
|---|---|---|---|
| 5,245,365 A * | 9/1993 | Woodard et al. | 347/86 |
| 6,530,634 B1 * | 3/2003 | Hara | 347/7 |
| 6,795,203 B1 * | 9/2004 | Akahane et al. | 358/1.1 |
| 2002/0127906 A1 * | 9/2002 | Soon | 439/501 |

FOREIGN PATENT DOCUMENTS

| | | |
|---|---|---|
| JP | 7-89190 | 4/1995 |
| JP | 7-132664 | 5/1996 |
| JP | 10-142702 | 5/1998 |
| JP | 2001-071522 | 3/2001 |
| JP | 2003-060858 | 2/2003 |
| JP | 2003-237957 | 8/2003 |

* cited by examiner

*Primary Examiner*—Dean A. Reichard
*Assistant Examiner*—Andargie M Aychillhum
(74) *Attorney, Agent, or Firm*—Edwards Angell Palmer & Dodge LLP; John J. Penny, Jr.

(57) ABSTRACT

An electronic apparatus includes a circuit portion having a connector to which an interface cable is connected, a case for accommodating the circuit portion and having a wiring route for the interface cable leading from the connector to an external space and a connection opening for exposing the wiring route, and a cover for opening or closing the connection opening.

13 Claims, 7 Drawing Sheets

ELECTRONIC APPARATUS

BACKGROUND OF THE INVENTION

The present invention relates to an electronic apparatus. Conventionally, an electronic apparatus for conducting data communication with another apparatus connected by an interface cable is known. For example, a printer, an image scanner, a combination machine, or the like is used by being connected to a personal computer by a wired interface of various standards such as USB, IEEE 1394, and the like.

In a case where stationary type electronic apparatuses such as a desktop type computer, a printer, an image scanner, a combination machine, and the like are connected to each other, it is desirable to wire an interface cable in the rear portion of each apparatus. Accordingly, in conventional stationary type electronic apparatuses, an operation panel is provided on the front portion of a case, and a connector for an interface cable is provided in a rear portion of the case, so as to improve the ease of use. In addition, in a case where such a stationary type electronic apparatus is provided with an interface for a removable memory, it is desirable to provide in the front portion of the case a slot for inserting the removable memory.

Meanwhile, inside the case, a connector for the interface cable, a chip constituting a controlling portion for the interface, a chip constituting a controlling portion for the removable memory, and a chip constituting a central control unit are desirably mounted on the same substrate in proximity to each other to improve the reliability of synchronous control of a high-frequency signal.

SUMMARY OF THE INVENTION

However, it is generally difficult to ensure the degree of freedom in design while simultaneously satisfying the requirements for the layout of the exterior of the case occurring in the light of the ease of use and the requirements for the layout of the interior of the case in the mounting technology.

The invention has been devised in view of the above-described problems, and its object is to provide an electronic apparatus which excels in the ease of use and has a high degree of freedom in design.

To attain the above object, the electronic apparatus, according to the invention, comprising: a circuit portion having a connector to which an interface cable is connected; a case for accommodating the circuit portion and having a wiring route for the interface cable leading from the connector to an external space and a connection opening for exposing the wiring route; and a cover for opening or closing the connection opening. By providing the wiring route for the interface cable inside the electronic apparatus, it is possible to lead the interface cable from the internal space of the electronic apparatus out to the external space at a position where the ease of use is excellent although it may be far from the position of the connector. In addition, by providing the connection opening for exposing the wiring route inside the electronic apparatus and the cover for opening or closing it, the interface cable can be withdrawn from and inserted into the connector provided inside the electronic apparatus. Therefore, according to the invention, it is possible to realize an electronic apparatus which excels in the ease of use and has a high degree of freedom in design.

Furthermore, the electronic apparatus in accordance with the invention is characterized in that the case is provided with an operation panel on a front portion thereof, and has a connection port for allowing the external space and the wiring route to communicate with each other on a rear portion thereof. By providing the operation panel on the front portion of the case and by providing the connection port for the cable in the rear portion of the case, it is possible to improve the ease of use of the stationary type electronic apparatus.

Furthermore, the electronic apparatus in accordance with the invention is characterized in that the connection opening exposes the wiring route in its entirety. By adopting an arrangement in which the wiring route can be exposed in its entirety, the detachment and attachment of the interface cable are facilitated.

Furthermore, the electronic apparatus in accordance with the invention is characterized by further including: a printing section which is accommodated in the case, the electronic apparatus functioning as a printer, wherein the case has a maintenance opening which exposes the printing section, and the cover is connected to the case in such a manner as to be movable from a position for closing the connection opening and the maintenance opening to a position for opening the connection opening and the maintenance opening. By adopting an arrangement in which the connection opening for exposing the wiring route of the interface cable is also opened by moving the cover for closing the maintenance opening for providing maintenance to the printing section, the structure of the electronic apparatus which functions as the printer becomes simple.

Furthermore, the electronic apparatus in accordance with the invention is characterized in that the case has an operation panel and an insertion port for a removable memory on the front portion, and has a connection port for allowing the external space and the wiring route to communicate with each other on the rear portion, and that the circuit portion has a memory controlling portion for controlling the removable memory, an interface controlling portion for controlling the transmission and reception of a signal through the interface cable, and a substrate for mounting thereon the connector, the memory controlling portion, and the interface controlling portion. Since the connector, the memory controlling portion, and the interface controlling portion are mounted on one substrate, it is possible to improve the reliability of the electronic apparatus which effects signal processing at high speed. In addition, as a result of the provision of the operation panel and the removable memory in the front portion of the case, the provision of the connection port for the interface cable in the rear portion of the case, and the provision of the wiring route or the interface cable inside the electronic apparatus, it is possible to reduce the manufacturing cost by improving the ease of use of the electronic apparatus without a decline in reliability.

Furthermore, the electronic apparatus in accordance with the invention is characterized in that the case has connection ports on at least the front portion and the rear portion respectively, for the interface cable for inputting data to be printed by the printing section, and that the circuit portion has a first connector to which a first interface cable led out to the external space through the wiring route is connected and which is spaced apart from one of the connection ports, a second connector which is exposed from another one of the connection ports and to which a second interface cable is connected, an interface controlling portion for controlling the transmission and reception of a signal through the first interface cable and the second interface cable, and a substrate for mounting thereon the first connector, the second connector, and the interface controlling portion. Since the two connectors and the interface controlling portion for controlling the transmission and reception of a signal through the interface cables respectively connected to these connectors are mounted on one substrate, it is possible to improve the reliability of the electronic apparatus which effects signal processing at high speed. As compared with a case where a control portion is provided for each connector, the manufacturing cost can be reduced and the apparatus can be made compact. In addition, by adopting the arrangement in which one of the two interface cables for inputting data to the printing section can be connected from the rear portion of the case, and the other one can be connected from the front portion of the case, an interface cable for connecting to a stationary type electronic apparatus such as a desktop type computer can be wired to the rear side of the case, while an interface cable for connecting a portable type electronic apparatus such as a digital camera can be wired to the front side of the case. Therefore, it is possible to improve the ease of use of the electronic apparatus having the printing function.

BRIEF DESCRIPTION OF THE DRAWINGS

The above and other objects and advantages of the invention will become more apparent from a detailed description of a preferred embodiment with reference to the accompanying drawings wherein.

DESCRIPTION OF THE PREFERRED EMBODIMENT

Hereafter, a description will be given of an embodiment of the invention.

Figure 1:
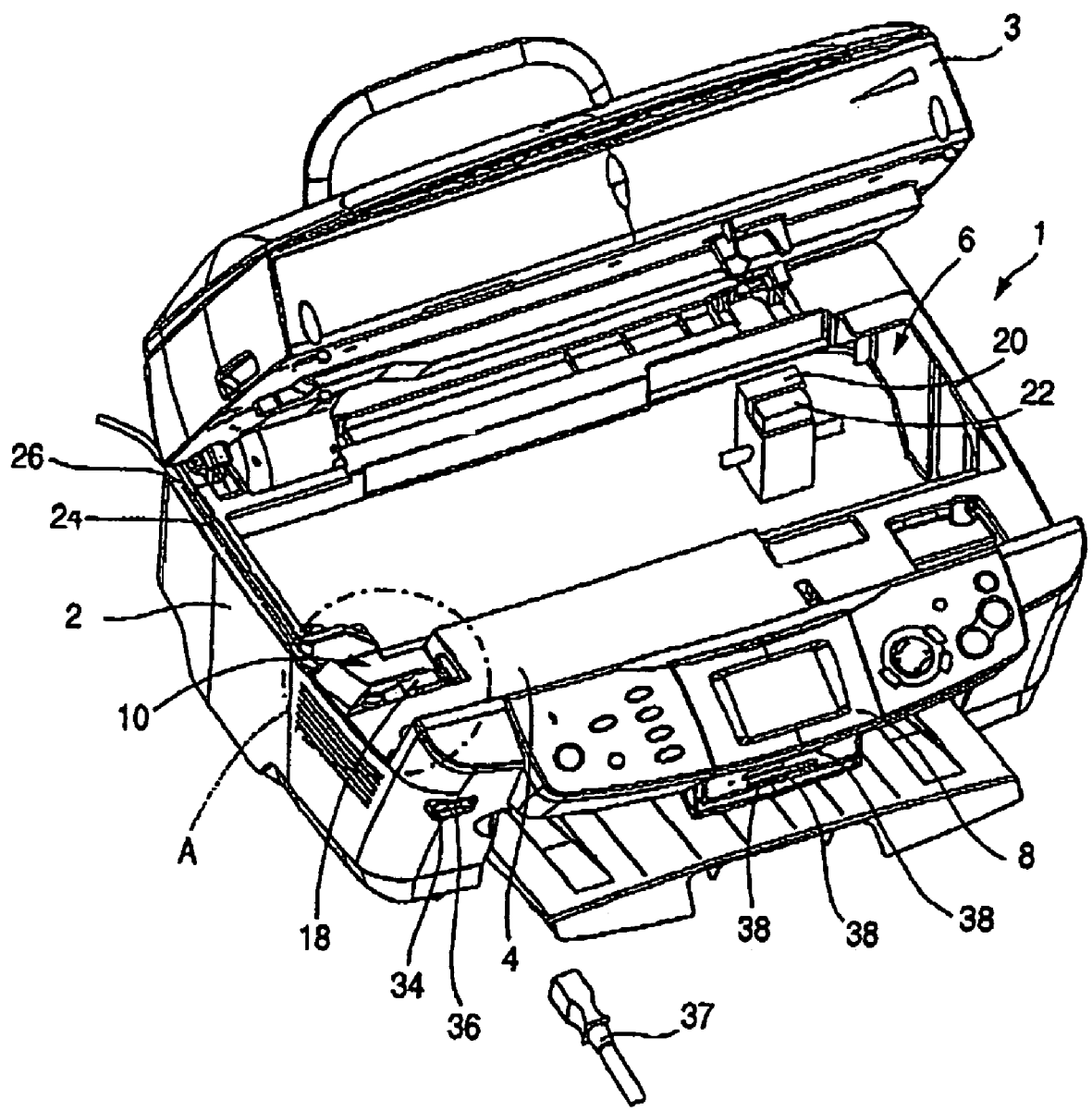
FIG. 1 is a perspective view according to an embodiment of the invention.
Figure 2:
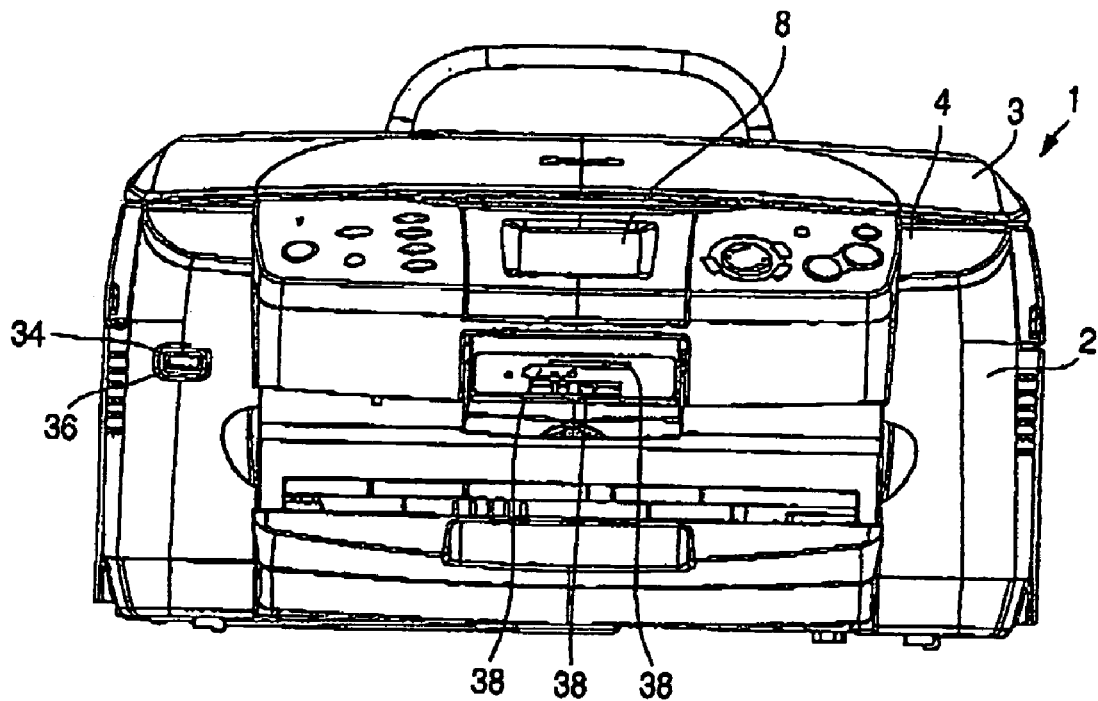
FIG. 2 is a front view according to the embodiment of the invention.

FIG. 1 is a perspective view of a combination machine 1 according to the embodiment of the invention. FIG. 2 is a front view of the combination machine 1. The housing of the combination machine 1 includes a printer case 2, a front case 4, and a scanner case 3, and the like.

A maintenance opening 6 is formed in the printer case 2 serving as a case.

A carriage 20 serving as a printing section, an ink cartridge 22, and the like are exposed through the maintenance opening 6. An unillustrated print head for ejecting ink, which is stored in the ink cartridge 22, toward printing paper is mounted on the carriage 20.

The printing section may be formed on the basis of any printing method such as an ink jet system, a laser system, or the like. In addition, the maintenance opening 6 may expose only a paper feeding and discharging mechanism for a countermeasure against a paper jam.

The scanner case 3 serving as a cover is rotatably connected to the printer case 2 so as to be movable from a position for closing the maintenance opening 6 to a position for opening the maintenance opening 6. In the attitude of the scanner case 3 for opening the maintenance opening 6, the entire upper portion of the printer case 2 is made open.

A structure may be adopted in which the scanner case 3 and the printer case 2 are connected so that the scanner case 3 can slide on top of the printer case 2.

The font case 4 serving as a case is attached to an upper portion of a front part of the printer case 2. The front case 4 is provided with an operation panel 8.

Figure 3:
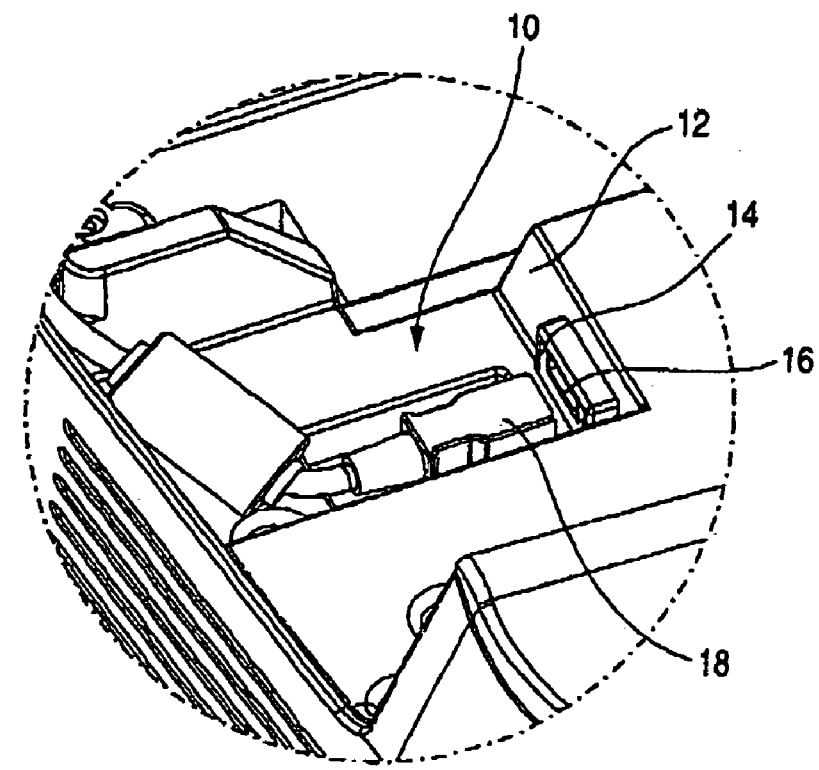
FIG. 3 is an enlarged view of an area A shown in FIG. 1.

FIG. 3 is an enlarged view of an area A shown in FIG. 1. A recessed portion 10 is formed in the front case 4. A first opening 14 is formed in a side wall 12 of the recessed portion 10. A USB connector 16 for PC connection (USB connector for a PC) serving as a first connector is exposed in the first opening 14. A USB cable 18 for PC connection (USB cable for a PC) serving as a first interface cable is connected to the USB connector 16 for a PC.

Figure 4A:
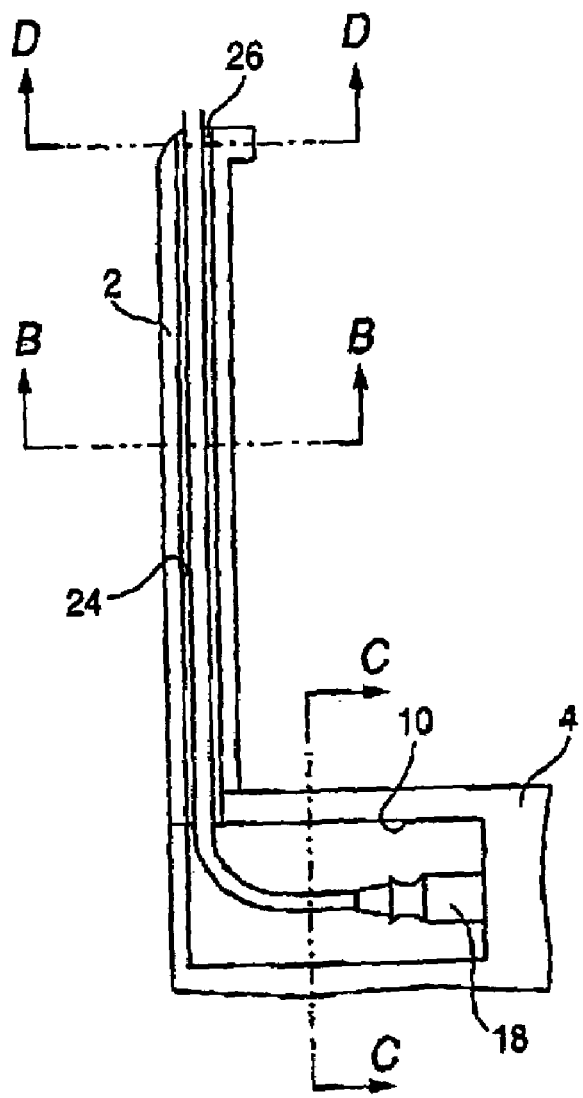
FIG. 4A is a schematic diagram according to the embodiment of the invention.
Figure 4B:
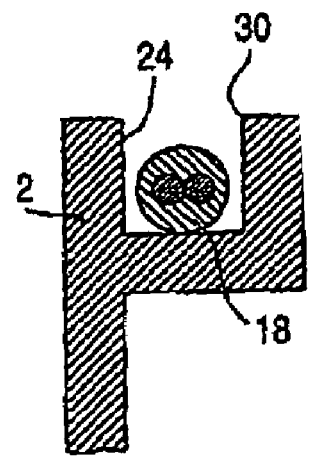
FIG. 4B is a cross-sectional view taken along line B-B of FIG. 4A.
Figure 4C:
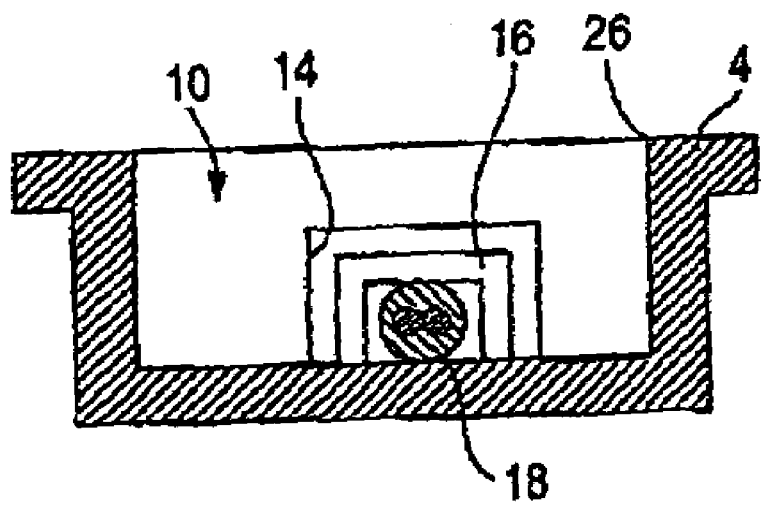
FIG. 4C is a cross-sectional view taken along line C-C of FIG. 4A.

As shown in FIGS. 1, 4A, and 4B, a groove portion 24 extending from the recessed portion 10 to a rear portion of the printer case 2 is formed in a side of the printer case 2. The USB cable 18 for a PC is accommodated in the groove portion 24. The groove portion 24 forms a wiring route for guiding the USB cable 18 for a PC to the rear portion of the printer case 2.

Figure 4D:
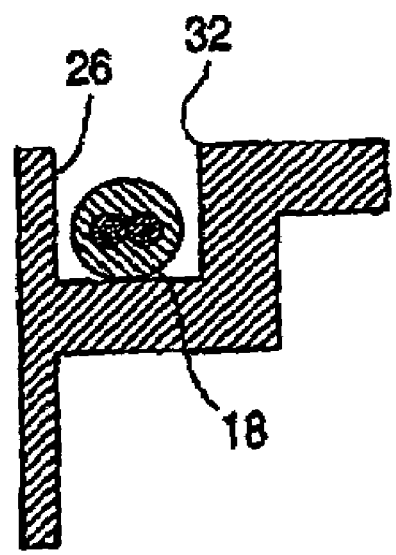
FIG. 4D is a cross-sectional view taken along line D-D of FIG. 4A.

As shown in FIGS. 1, 4A and 4D, a connection port 26 is formed in a rear surface of the combination machine 1. The connection port 26 corresponds to one end of the groove portion 24 and allows the external space and the wiring route formed by the groove portion 24 to communicate each other. The USB cable 18 for a PC is led from the connection port 26 to outside the apparatus. An unillustrated stationary type electronic apparatus (PC) such as a desktop type computer is connected to the combination machine 1 by the USB cable 18 for a PC. The first opening 14, the recessed portion 10, the groove portion 24, and the connection port 26 correspond to the wiring route. In addition, an upper opening 28 of the recessed portion 10, an upper opening 30 of the groove portion 24, and an upper opening 32 of the connection port 26 correspond to a connection opening of the invention.

As shown in FIGS. 1 and 2, a second opening 34 is formed in a front surface of the printer case 2. A USB connector 36 for connection to an external memory device (USB connector for an external memory) serving as a second connector is exposed in the second opening 34. A USB cable 37 for connection to an external memory device (USB cable for an external memory) serving as a second interface cable is connected to the USB connector 36 for an external memory. An unillustrated external memory device is connected to the combination machine 1 by the USB cable 37 for an external memory.

Insertion ports 38 for a plurality of kinds of removable memories are formed in the front surface of the printer case 2. An unillustrated removable memory is inserted in each of the insertion ports 38, and the removable memory is connected to a connector 40 for a removable memory (memory connector), which will be described later.

Figure 5:
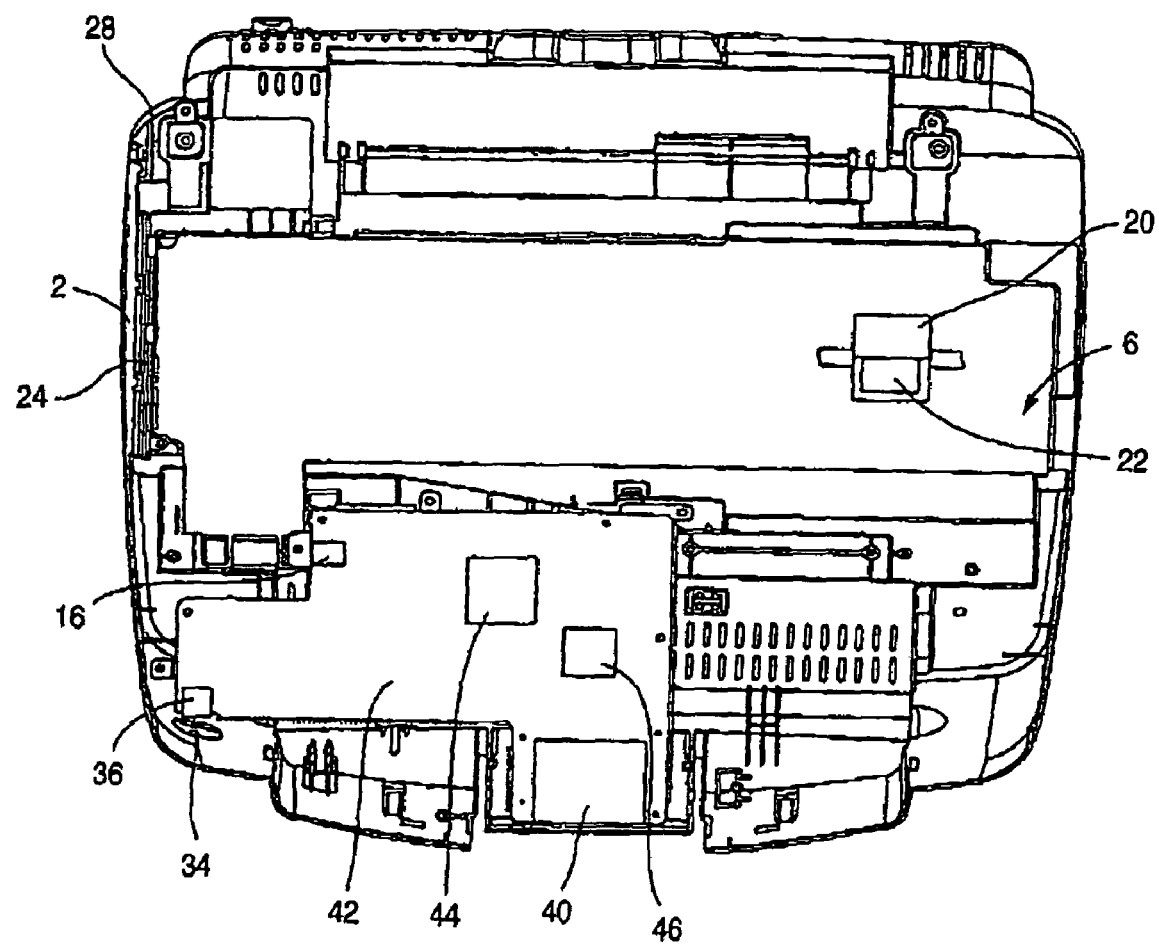
FIG. 5 is a plan view according to the embodiment of the invention.

FIG. 5 is a top plan view of the combination machine 1 in a state in which the front case 4 is removed.

A main-board 42 serving as a circuit portion is mounted on the front portion of the printer case 2.

The following are mounted on the mainboard 42: the USB CONNECTOR 16 FOR A PC, the USB connector 36 for an external memory, the memory connector 40, a CPU 44 incorporating a USB controller, unillustrated memories, a controller 46 for removable memories (memory controller), and the like. The USB connector 16 for a PC is disposed at a position spaced apart from the connection port 26 formed in a rear portion of the printer case 2. The USB connector 36 for an external memory is disposed in the vicinity of the second opening 34 formed in the front surface of the printer case 2. The memory connector 40 is disposed in the vicinity of the insertion ports 38.

The CPU 44 is electrically connected to the unillustrated memories, the USB CONNECTOR 16 FOR A PC, the USB connector 36 for an external memory, and the memory controller 46. The CPU 44 controls the respective portions of the combination machine 1 in accordance with a program stored in the unillustrated memory. The CPU 44 also functions as an interface controlling portion. The CPU 44 receives a control signal, image data, and the like from the PC through USB communication. In addition, the CPU 44 receives image data and the like from the external memory device through the USB communication.

Although the CPU 44 incorporating the USB controller has been illustrated, the CPU and the USB controller may be formed on separate chips.

The memory connector 40 is electrically connected to the memory controller 46. The CPU 44 controls the memory controller 46. The memory controller 46 reads image data and the like subject to printing from a removable memory by controlling the removable memory. The memory controller 46 and the memory connector 40 correspond to a memory controlling portion.

According to the above-described embodiment, the connection port 26 is provided in the rear portion of the printer case 2, and the USB cable 18 for a PC which is not frequently attached or detached is led out from the rear portion of the combination machine 1. Accordingly, the wiring of the USB cable 18 for a PC which is connected to the stationary type electronic apparatus is not conspicuous, so that the appearance is good.

In addition, since the second opening 34 and the insertion ports 38 are provided on the front surface side where the operation panel 8 is provided, the connection or disconnection of the external memory device, the insertion or removal of the removal memory, and the operation of the operation panel, which are frequently performed by a user, can be effected from the front surface side, so that the operating efficiency is excellent. Accordingly, the ease of use of the combination machine 1 improves.

In addition, by providing the first opening 14, the recessed portion 10, and the groove portion 24, the USB cable 18 for a PC is guided from the front surface side of the combination machine 1 to the rear surface side where the connection port 26 is provided, and the USB cable 18 for a PC is led out from the connection port 26 of the combination machine 1. Therefore, the USB connector 16 for a PC can be disposed on the front surface side of the combination machine 1. Accordingly, the USB connector 36 for an external memory disposed in the vicinity of the second opening 34, the memory connector 40 disposed in the vicinity of the insertion ports 38, the CPU 44, and the memory controller 46 can be mounted on the same main-board 42. Hence, it is possible to improve the reliability in USB communication between the CPU 44 and the PC and signal processing between the CPU 44 and the removable memory without impairing the ease of use, and improve the degree of freedom in the design of the main-board 42. In addition, the size of the main-board 42 can be made compact, and the manufacturing cost can be reduced. In addition, as compared with a case where the main-board is connected by a connector or connected by a cable by providing a separate substrate for mounting a USB controller, it is possible to reduce the manufacturing cost of the circuit portion.

COMPARATIVE EXAMPLE

Figure 7:
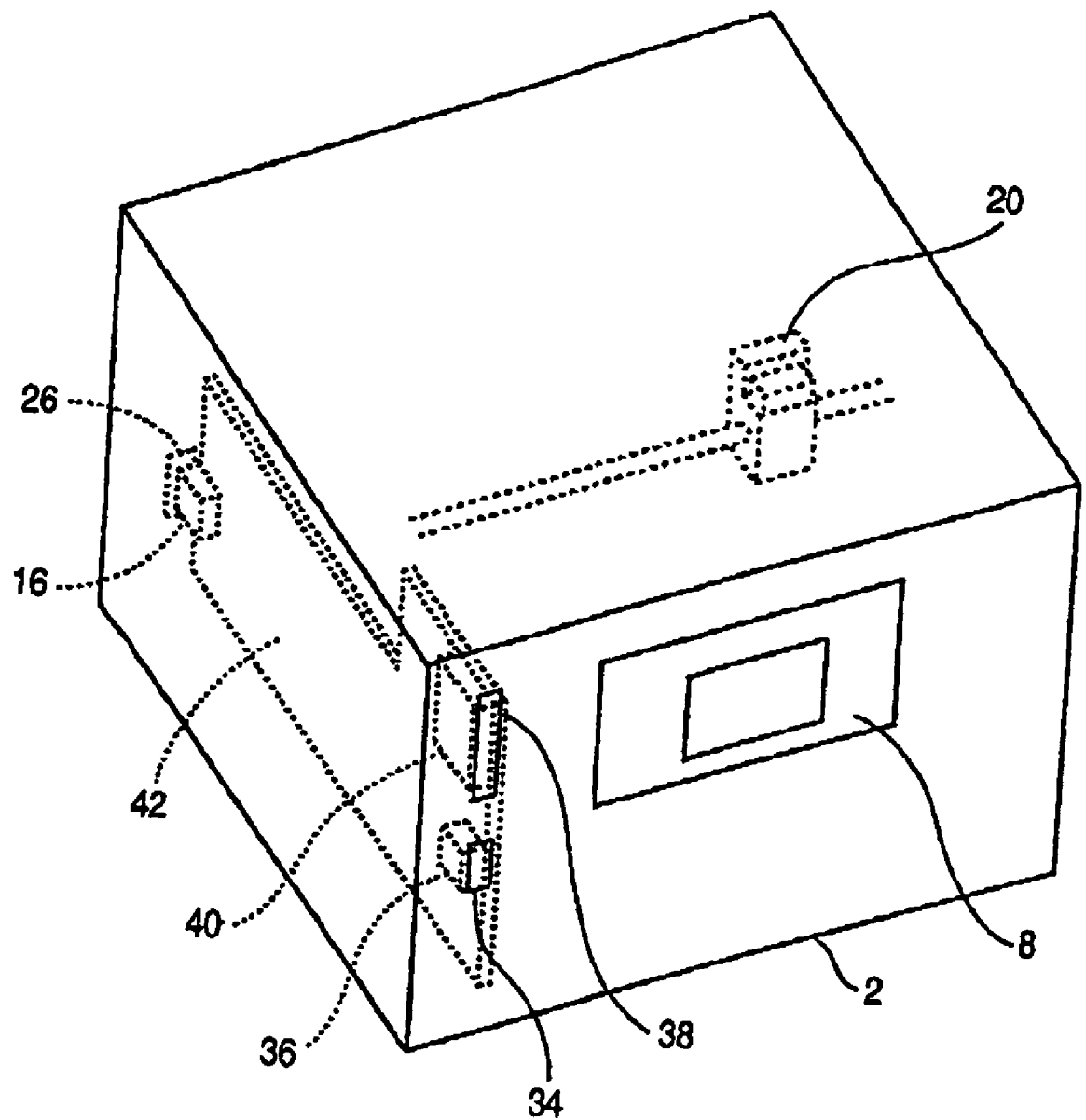
FIG. 7 is a schematic diagram according to the related art.

FIG. 7 is a schematic diagram illustrating the combination machine as a comparative example of the invention. In the comparative example of the invention, the USB connector 36 for an external memory and the memory connector 40 are respectively disposed in the vicinities of the second opening 34 and the insertion port 38 formed in the front portion of the printer case 2, while the USB connector 16 for a PC is disposed in the vicinity of the connection port 26 formed in the rear portion of the printer case 2. Since a high-speed signal is transmitted, the USB connector 36 for an external memory, the memory connector 40, and the USB connector 16 for a PC should desirably be mounted on the same main-board 42. Accordingly, the main-board 42 has a shape in which it extends from the front portion to the rear portion of the printer case 2. In addition, since the printing section such as the carriage 20 and the unillustrated paper feeding and discharging mechanism are disposed in a central portion of the printer case 2, the main-board 42 is installed vertically on a side portion of the printer case. Namely, in the combination machine as the comparative example of the invention, since the USB connector 16 for a PC is provided in the rear portion of the case, the design becomes such that the insertion port 38 is vertically elongated and is offset toward the side portion of the printer case 2.

On the other hand, according to the above-described embodiment, since the USB cable 18 for a PC is guided freely along the wiring route, the USB connector 16 for a PC is disposed at a predetermined position, and the connection port 26 can be formed at a predetermined position. Accordingly, since the main-board 42 can be installed horizontally in the front portion of the printer case 2, the second opening 34 and the insertion port 38 become horizontally elongated, as shown in FIG. 2. In addition, the insertion ports 38 can be formed in the center of the front portion of the printer case 2. In comparison with the design of the comparative example in which the second opening 34 and the insertion port 38 become vertically elongated relative to the horizontally elongated design of the operation panel 8, it is possible to obtain a neat design. In other words, it is possible to improve the degree of freedom in the design of the appearance.

Further, if the scanner case 3 is set in an attitude in which the maintenance opening 6 is open, all of the first opening 14, the recessed portion 10, the groove portion 24, and the connection port 26 can be exposed. Accordingly, since the USB cable 18 for a PC can be easily inserted into and removed from the USB connector 16 for a PC provided inside the combination machine 1, the ease of use improves. In addition, since the scanner case 3 for opening and closing the maintenance opening 6 is used as a cover for the connection opening, a separate structure is not required. Accordingly, the structure of the combination machine 1 becomes simple.

Figure 6:
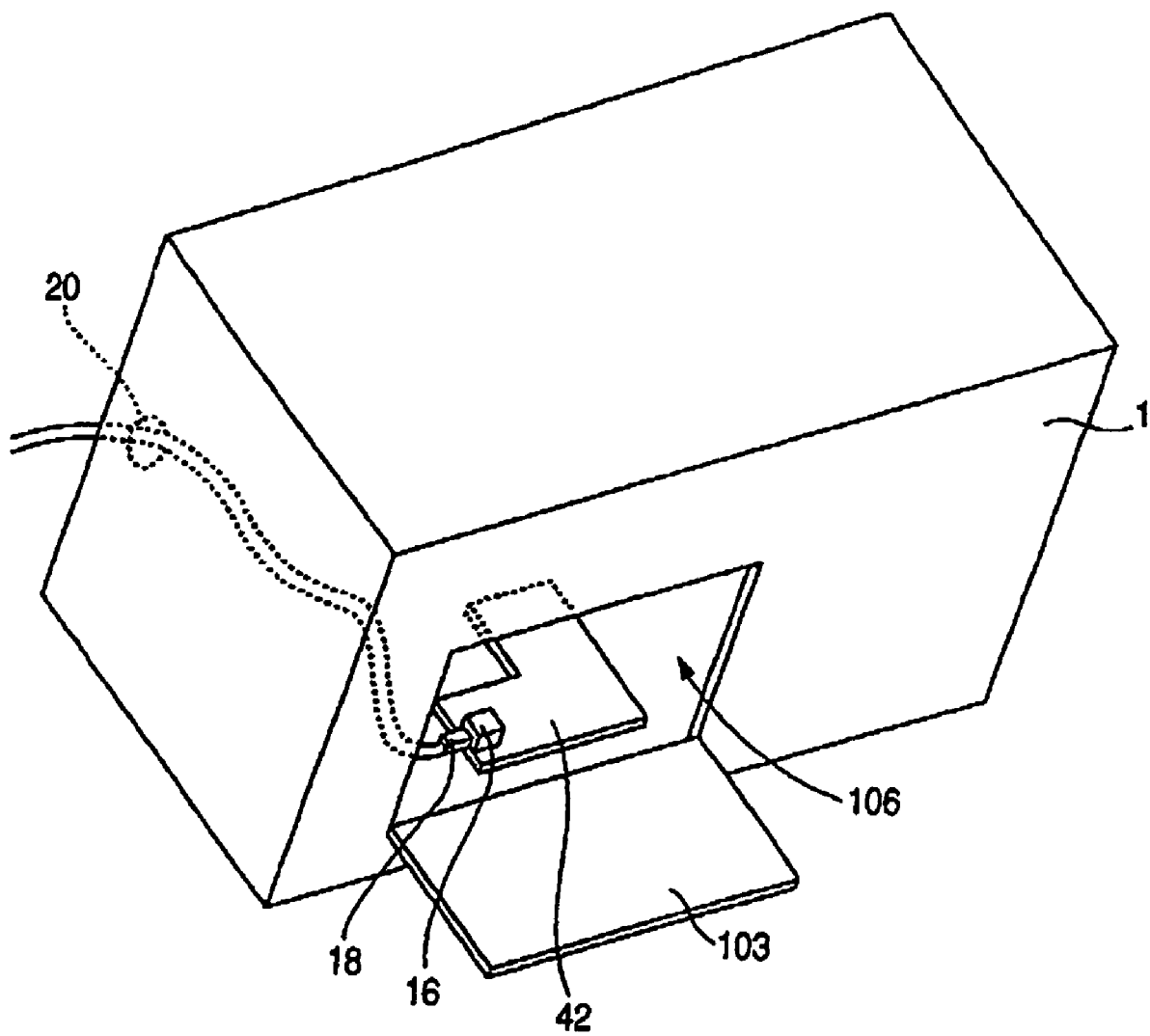
FIG. 6 is a schematic diagram according to the embodiment of the invention.

Although in the above-described embodiment the USB cable 18 for a PC is guided by the groove portion 24 formed by an outer wall of the front case 4, the USB cable 18 for a PC may not be retained inside the case 1 in which the substrate 42 with the connector 16 mounted thereon is accommodated, as shown in FIG. 6.

In addition, if the USB cable 18 for a PC can be easily removed from and inserted into the USB connector 16 for a PC, the wiring route may be partially exposed by providing in the case 2 an opening 106 serving as the connection opening and a cover 103 for opening and closing the opening 106, as shown in FIG. 6.

In addition, although in the above-described embodiment the connection opening is provided in the outer portion of the case and is not communicated with the internal space of the case, the connection opening may be formed as the opening 106 allowing the internal space of the case 2 and the external space to communicate with each other, as shown in FIG. 6.

In addition, although in the above-described embodiment the combination machine 1 has been illustrated as the electronic apparatus, the electronic apparatus to which the invention is applied may be a scanner, a printer, a stationary type PC, or the like.

In addition, although in the above-described embodiment the USB cable has been illustrated as the interface cable, the interface cable may be a cable of any standards, such as an IEEE 1394 cable, a parallel cable, or the like.

What is claimed is:

1. An electronic apparatus, comprising:
   a circuit portion, which has a connector to be connected with an interface cable;
   a case, which accommodates the circuit portion and has a wiring route for the interface cable leading from the connector to an external space and a connection opening portion for exposing the wiring route;
   a cover, which opens and closes the connection opening portion; and
   a printing section, which is accommodated in the case, the electronic apparatus functioning as a printer,
   wherein the case has a maintenance opening portion, which exposes the printing section,
   wherein the cover is connected to the case so as to be movable from a position for closing the connection opening portion and the maintenance opening portion to a position for opening the connection opening portion and the maintenance opening portion
   wherein the case has an operation panel and an insertion port for a removable memory on a front portion thereof;
   wherein the case has a connection port for allowing the external space and the wiring route to communicate with each other on a rear portion thereof; and
   wherein the circuit portion has a memory controlling portion for controlling the removable memory, an interface controlling portion for controlling the transmission and reception of a signal through the interface cable, and a substrate on which the connector, the memory controlling portion and the interface controlling portion are mounted; and
   wherein the wiring route is formed in a side of the case and extended from the front portion of the case to the rear portion of the case.

2. The electronic apparatus as set forth in claim 1, wherein the connection opening portion exposes the wiring route in its entirety.

3. The electronic apparatus as set forth in claim 1, wherein the case has connection ports on at least the front portion and the rear portion respectively, for the interface cable for inputting data to be printed by the printing section; and
   wherein the circuit portion includes:
      a first connector to be connected with a first interface cable led out to the external space through the wiring route and which is spaced apart from one of the connection ports;
      a second connector which is exposed from another one of the connection ports and to be connected with a second interface cable;
      an interface controlling portion which controls the transmission and reception of a signal through the first interface cable and the second interface cable; and
      a substrate, on which the first connector, the second connector, and the interface controlling portion are mounted.

4. A printer, comprising:
   a printing section;
   a circuit section, having a connector for an interface cable to connect the printer and a host device;
   a case, accommodating the printing section and having an outer face which is formed with a recessed portion for accommodating the interface cable connected to the connector;
   an opening leading the interface cable connected to the connector from the recessed portion to outside of the case; and
   a cover, adapted to open and close the recessed portion.
   wherein the cover is capable of closing the recessed portion in a state in which the opening is opened to the outside.

5. The printer as set forth in claim 4, wherein the outer face is an upper face of the case.

6. The printer as set forth in claim 4, wherein the cover is provided as a scanner case.

7. The printer as set forth in claim 4, wherein the connector is disposed at the front of a carriage provided in the printing section; and
   wherein the recessed portion extends from the front of the carriage to the rear thereof.

8. The printer as set forth in claim 4, wherein the recessed portion includes a first recessed portion formed into a groove and a second recessed portion of which the width is more than that of the first recessed portion, the second recessed portion disposed in the vicinity of the connector and communicated with the first recessed portion.

9. The printer as set forth in claim 8, wherein the first recessed portion extends in a direction crossing an insertion direction of the interface cable into the connector.

10. The printer as set forth in claim 4, wherein the case accommodates the circuit section in a manner that the connector is exposed from the outer face of the case.

11. A printer, comprising:
    a printing section;
    a circuit section, having a connector for an interface cable to connect the printer and a host device;
    a case, accommodating the printing section;
    a wiring route, formed on the case to be exposed to the outside of the case and extended along the side of the case to lead the interface cable connected to the connector;
    an opening leading the interface cable connected to the connector from the wiring route to outside of the case; and
    a cover, adapted to open and close an exposed portion of the wiring route.

12. A printer, comprising:
    a printing section;
    a circuit section, having a connector for an interface cable to connect the printer and a host device;
    a case, accommodating the printing section and formed with a maintenance opening which exposes the printing section;
    a wiring route, formed on the case to lead the interface cable connected to the connector;

an opening leading the interface cable connected to the connector from the wiring route to outside of the case; and a cover, adapted to open and close the maintenance opening portion and an exposed portion of the wiring route.

13. The printer as set forth in claim 12, wherein the wiring route is formed so as to circumvent the maintenance opening portion.

* * * * *